(12) United States Patent
Bai et al.

(10) Patent No.: US 10,032,810 B2
(45) Date of Patent: Jul. 24, 2018

(54) IMAGE SENSOR WITH DUAL LAYER PHOTODIODE STRUCTURE

(71) Applicant: SEMICONDUCTOR COMPONENTS INDUSTRIES, LLC, Phoenix, AZ (US)

(72) Inventors: Yingjun Bai, San Jose, CA (US); Qun Sun, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 288 days.

(21) Appl. No.: 14/793,480

(22) Filed: Jul. 7, 2015

(65) Prior Publication Data

US 2015/0311242 A1 Oct. 29, 2015

Related U.S. Application Data

(63) Continuation of application No. 12/826,313, filed on Jun. 29, 2010, now abandoned.

(51) Int. Cl.
| | |
|---|---|
| H01L 27/146 | (2006.01) |
| H04N 5/33 | (2006.01) |
| H04N 5/369 | (2011.01) |
| H04N 9/04 | (2006.01) |

(52) U.S. Cl.
CPC .... *H01L 27/14605* (2013.01); *H01L 27/1461* (2013.01); *H01L 27/14607* (2013.01); *H01L 27/14621* (2013.01); *H01L 27/14647* (2013.01); *H01L 27/14652* (2013.01); *H04N 5/33* (2013.01); *H04N 5/332* (2013.01); *H04N 5/369* (2013.01); *H04N 9/045* (2013.01)

(58) Field of Classification Search
CPC ......... H01L 27/14605; H01L 27/14647; H01L 27/14621; H01L 27/14607; H04N 5/369; H04N 9/045; H04N 5/33
USPC .......................................... 348/164; 257/432
See application file for complete search history.

(56) References Cited

U.S. PATENT DOCUMENTS

| | | |
|---|---|---|
| 5,485,204 A | 1/1996 | Taniji |
| 5,745,171 A | 4/1998 | Ogawa et al. |
| 6,281,561 B1 | 8/2001 | Stiebig et al. |

(Continued)

FOREIGN PATENT DOCUMENTS

WO 2010070869 A1 6/2010

*Primary Examiner* — Andy Rao
*Assistant Examiner* — Zaihan Jiang
(74) *Attorney, Agent, or Firm* — Kevin B. Jackson

(57) ABSTRACT

An image system with a dual layer photodiode structure is provided for processing color images. In particular, the image system can include an image sensor that can include photodiodes with a dual layer photodiode structure. In some embodiments, the dual layer photodiode can include a first layer of photodiodes (e.g., a bottom layer), an insulation layer disposed on the first layer of photodiodes, and a second layer of photodiodes (e.g., a top layer) disposed on the insulation layer. The first layer of photodiodes can include one or more suitable pixels (e.g., green, blue, clear, luminance, and/or infrared pixels). Likewise, the second layer of photodiodes can include one or more suitable pixels (e.g., green, red, clear, luminance, and/or infrared pixels). An image sensor incorporating dual layer photodiodes can gain light sensitivity with additional clear pixels and maintain luminance information with green pixels.

18 Claims, 11 Drawing Sheets

(56) References Cited

U.S. PATENT DOCUMENTS

| | | |
|---|---|---|
| 7,164,444 B1 | 1/2007 | Merrill |
| 7,419,844 B2 | 9/2008 | Lee et al. |
| 7,652,701 B2 | 1/2010 | Osada et al. |
| 7,773,137 B2 | 8/2010 | Inoue |
| 7,786,426 B2 | 8/2010 | Yamashita et al. |
| 7,839,437 B2 | 11/2010 | Kasai et al. |
| 7,952,636 B2 | 5/2011 | Ikeda et al. |
| 8,125,547 B2 | 2/2012 | Oda et al. |
| 2003/0189237 A1* | 10/2003 | Koizumi ........... H01L 27/14647 257/461 |
| 2003/0189656 A1* | 10/2003 | Shinohara ......... H01L 27/14645 348/272 |
| 2004/0017497 A1 | 1/2004 | Suzuki et al. |
| 2005/0017154 A1 | 1/2005 | Ozumi |
| 2005/0178948 A1 | 8/2005 | Lee et al. |
| 2006/0181623 A1 | 8/2006 | Endo et al. |
| 2007/0131987 A1 | 6/2007 | Kim |
| 2007/0218578 A1 | 9/2007 | Lee et al. |
| 2008/0149976 A1 | 6/2008 | Lim |
| 2008/0160723 A1 | 7/2008 | Hannebauer |
| 2008/0280388 A1 | 11/2008 | Ishida et al. |
| 2008/0296643 A1* | 12/2008 | Inoue ................ H01L 27/14603 257/292 |
| 2008/0303072 A1 | 12/2008 | Lee et al. |
| 2009/0009637 A1 | 1/2009 | Wada |
| 2009/0015693 A1 | 1/2009 | Wada |
| 2009/0040353 A1 | 2/2009 | Yamamoto |
| 2009/0078316 A1* | 3/2009 | Khazeni ................ G02B 5/284 136/257 |
| 2009/0079855 A1 | 3/2009 | Ito et al. |
| 2009/0085135 A1 | 4/2009 | Bang |
| 2009/0135167 A1 | 5/2009 | Sakai et al. |
| 2009/0152604 A1 | 6/2009 | Zhu et al. |
| 2009/0152664 A1* | 6/2009 | Klem ................ H01L 27/14603 257/440 |
| 2009/0160981 A1* | 6/2009 | Baumgartner .... H01L 27/14603 348/274 |
| 2009/0200584 A1* | 8/2009 | Tweet ............... H01L 27/14645 257/292 |
| 2009/0200626 A1* | 8/2009 | Qian ................. H01L 27/14621 257/432 |
| 2009/0213256 A1 | 8/2009 | Kudoh |
| 2009/0219410 A1 | 9/2009 | Hsu et al. |
| 2010/0102229 A1* | 4/2010 | Klinghult .......... H01L 27/14647 250/338.1 |
| 2010/0157116 A1 | 6/2010 | Kikuchi |
| 2011/0037869 A1 | 2/2011 | Hiramoto et al. |
| 2011/0181749 A1* | 7/2011 | Yamada ............. H01L 27/1461 348/222.1 |
| 2011/0249158 A1 | 10/2011 | Hynecek |

\* cited by examiner

IMAGE SENSOR WITH DUAL LAYER PHOTODIODE STRUCTURE

CROSS-REFERENCE TO RELATED APPLICATION

The present application is a continuation of U.S. application Ser. No. 12/826,313 entitled IMAGE SENSOR WITH DUAL LAYER PHOTODIODE STRUCTURE filed Jun. 29, 2010, which is incorporated herein by reference in its entirety to provide continuity of disclosure.

FIELD OF THE INVENTION

This is directed to an image sensor with a dual layer photodiode structure.

BACKGROUND OF THE DISCLOSURE

Image sensors are used in many different types of electronic devices to capture an image. For example, modern cameras (e.g., video cameras and digital cameras) and other image capturing devices use image sensors to capture an image.

Image sensors typically have color processing capabilities. For example, an image sensor can include a color filter array ("CFA") that can separate various colors from a color image. The resulting output from the image sensor can then be interpolated to form a full color image.

DETAILED DESCRIPTION OF THE DISCLOSURE

Figure 1:
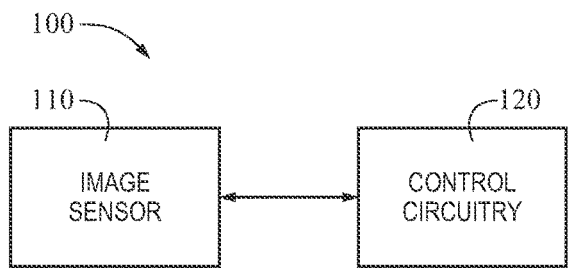
FIG. 1 is a schematic view of an illustrative electronic device configured in accordance with embodiments of the invention.

FIG. 1 is a schematic view of an illustrative electronic device configured in accordance with embodiments of the invention. Electronic device 100 can be any type of user device that utilizes an image sensor (embodied here as image sensor 110) and is controlled generally by control circuitry 120. For example, electronic device 100 can include a camera, such as a computer camera, still camera, or portable video camera. Electronic device 100 can also include any other components in a typical camera (or otherwise), which are not depicted in FIG. 1 to avoid any distractions from embodiments of the invention.

Image sensor 110 can capture image data corresponding to a streaming image. For example, image sensor 110 can include any combination of lenses and arrays of cells (e.g., charge-coupled devices ("CCDs") or complementary metal oxide semiconductor ("CMOS") sensor cells) for capturing light.

Control circuitry 120 may process data generated by image sensor 110, and may perform any suitable operations based on this data. For example, control circuitry 120 can obtain multiple color pixels (e.g., red, green, and/or blue pixels) generated by image sensor 110. Upon obtaining the color pixels, control circuitry 120 can optionally bin the color pixels in one or more dimensions to form one or more pixel groups (e.g., one or more red, green, and/or blue pixel groups). After binning the multiple color pixels, control circuitry 120 can interpolate the one or more pixel groups to output a pixel image. As used herein, a "pixel" can refer to a photodiode and/or a filter that is capable of responding to one or more wavelengths of light (e.g., responding to one or more colors). For example, a "color pixel" can correspond to a photodiode or a photodiode and filter combination capable of absorbing green, blue, or red wavelengths of light. As another example, a "clear pixel" can correspond to a photodiode or a photodiode and filter combination capable of absorbing all visible light or both visible light and near infrared signals. As yet another example, an "infrared pixel" can correspond to a photodiode or a photodiode and filter combination capable of absorbing near infrared and infrared signals.

Image sensor 110 and control circuitry 120 may be implemented using any suitable combination of hardware and software. In some embodiments, image sensor 110 can be implemented substantially all in hardware (e.g., as a system-on-a-chip ("SoC")). This way, image sensor 110 can have a small design that minimizes the area occupied on electronic device 100. In addition, image sensor 110 may have circuit components designed to maximize the speed of operation. Control circuitry 120 may include, for example, one or more processors, microprocessors, ASICS, FPGAs, or any suitable combination of hardware and software.

Figure 2A:
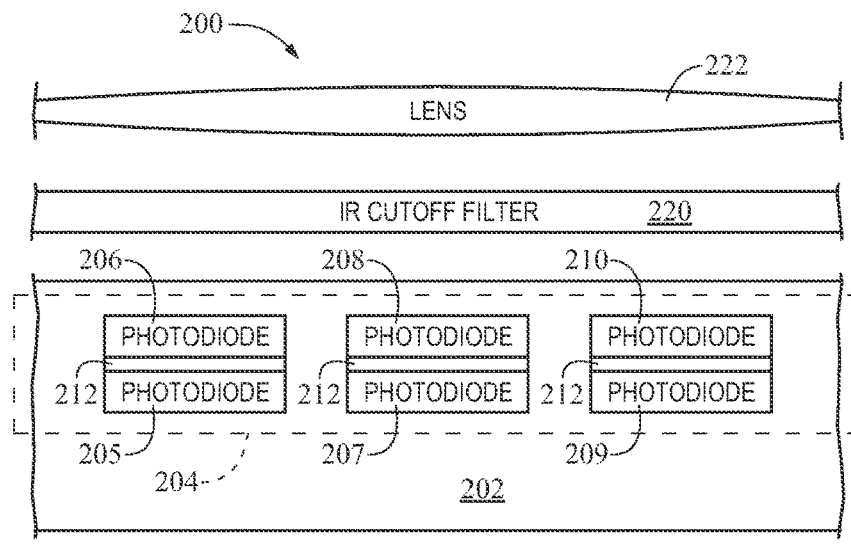
FIG. 2A is a cross-sectional view of a first illustrative image sensor in accordance with embodiments of the invention.
Figure 2B:
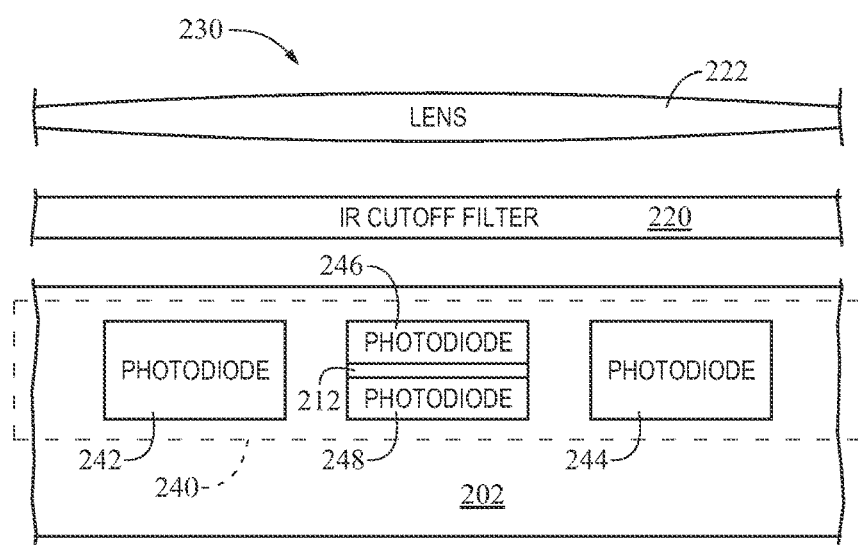
FIG. 2B is a cross-sectional view of a second illustrative image sensor in accordance with embodiments of the invention.
Figure 3:
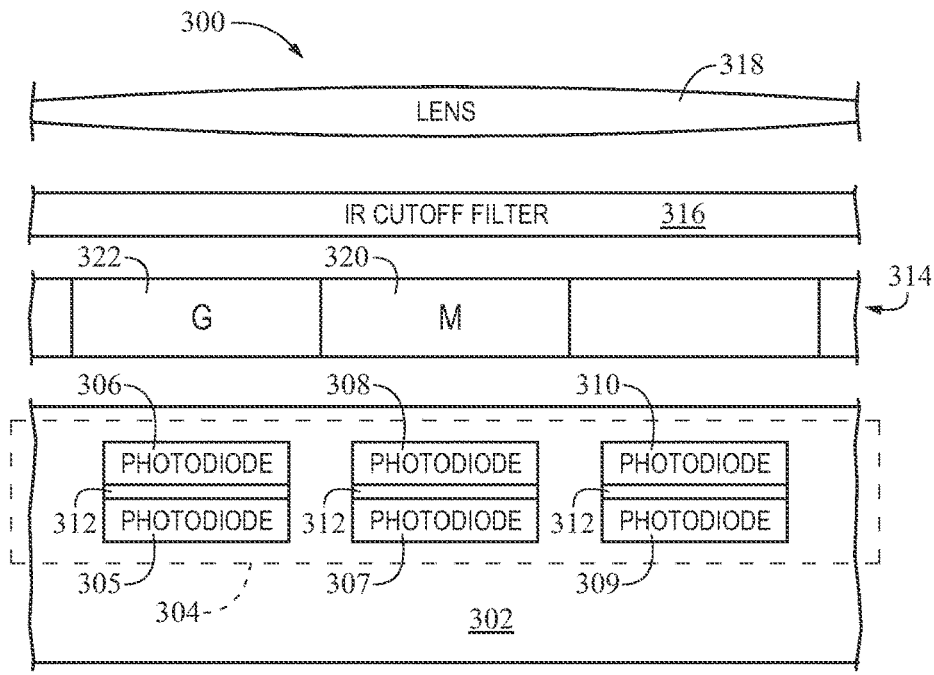
FIG. 3 is a cross-sectional view of a third illustrative image sensor in accordance with embodiments of the invention.
Figure 4:
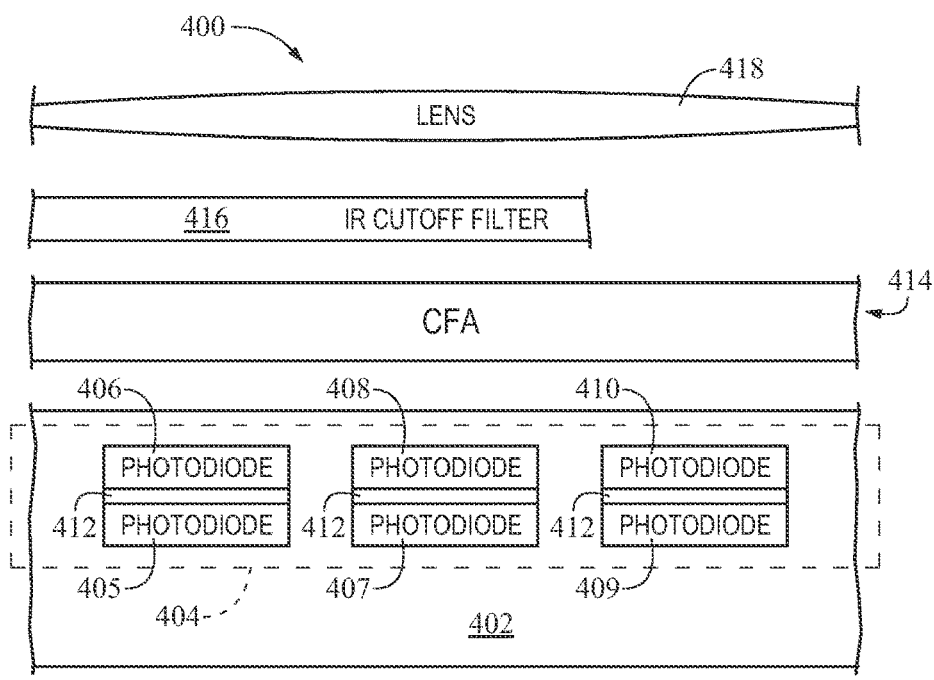
FIG. 4 is a cross-sectional view of a fourth illustrative image sensor in accordance with embodiments of the invention.

Turning now to FIGS. 2-4, these figures show illustrative image sensors in accordance with embodiments of the inventions. It will be understood that, for the sake of simplicity, not all of the layers of an image sensor are shown in FIGS. 2-4. For example, there may be metal interconnect layers formed between the layers shown and additional dielectric layers for insulation purposes. It will also be understood that image sensors of FIGS. 2-4 can include additional photodiodes not shown in FIGS. 2-4. It will further be understood that FIGS. 2-4 are not drawn to scale.

Turning first to FIG. 2A, a cross-sectional view of image sensor 200 is shown. Image sensor 200 can be the same as or substantially similar to image sensor 110 of FIG. 1. Image sensor 200 can include substrate 202 that can incorporate multiple photodiodes 204 (e.g., photodiodes 205-210). In some embodiments, image sensor 200 can include a color filter array ("CFA") (not shown in FIG. 2A). Photodiodes 204 can convert light into an electrical light signal that can then be processed by control circuitry (e.g., control circuitry 120 of FIG. 1) of an electronic device (e.g., electronic device 100 of FIG. 1). In particular, the level of intensity of light striking photodiodes 204 can affect the magnitude of the electronic signal that can be read by the control circuitry. For example, a higher intensity of light striking photodiodes 204 can generate an increase in the amount of charge collected by photodiodes 204.

In some embodiments, photodiodes 204 can have a dual layer photodiode pixel structure. Thus, photodiodes 204 can include a first layer (e.g., a bottom layer) of photodiodes such as, for example, photodiodes 205, 207, and 209. In addition, photodiodes 204 can include a second layer (e.g., a top layer) of photodiodes such as, for example, photodiodes 206, 208, and 210.

In some embodiments, the second layer of photodiode may not be disposed uniformly on top of all photodiodes in a first layer of photodiodes. For example, FIG. 2B shows a cross-sectional view of image sensor 230, which can include photodiodes 240. Image sensor 230 can be the same as or substantially similar to image sensor 110 of FIG. 1 and image sensor 200 of FIG. 2A.

At some photodiode position(s) in image sensor 230, photodiodes 240 may include only one thick integrated layer of photodiodes. For instance, as shown in FIG. 2B, photodiodes 242 and 244 can have a single layer photodiode pixel structure. However, at other photodiode position(s) in image sensor 230, a second layer of photodiodes may be present, which may be positioned adjacent to photodiodes 242 and 244. For instance, as shown in FIG. 2B, a second layer of photodiodes (e.g., photodiode 246) can be disposed on top of a first layer of photodiodes (e.g., photodiode 248). In some cases, the thickness of each of photodiodes 242 and 244 may be the same as or substantially similar to the combined thickness of photodiodes 246 and 248.

In some embodiments, an image sensor (e.g., image sensor 200 of FIG. 2A and/or image sensor 230 of FIG. 2B) can include insulation layer 212, which can be disposed between the first layer of the photodiodes and the second layer of the photodiodes. Insulation layer 212, which can provide insulation between the two layers, can be formed using any suitable dielectric material such as, for example, paper, plastic, glass, rubber-like polymers, and or any other suitable material.

One or more photodiodes 204 (e.g., a dual layer pair of photodiodes such as photodiodes 205 and 206, photodiodes 207 and 208, or photodiodes 209 and 210) or photodiodes 240 (e.g., a dual layer pair of photodiodes such as photodiodes 246 and 248) can correspond to color pixels, which can respond to different wavelengths of light based on the depths that each wavelength of light can reach inside the silicon. Accordingly, each photodiode of photodiodes 204 and/or photodiodes 240 may have a different spectral sensitivity curve.

The wavelengths of light from longest to shortest can be ranked as follows: red light, green light, and blue light. Physically, longer wavelengths of light can reach greater depth within the silicon. As such, the usual arrangement of photodiodes 204 can include photodiodes in one or more higher layers (e.g., a top layer) that can respond to shorter wavelengths of light (e.g., blue light). Photodiodes 204 can also include photodiodes in one or more lower layers (e.g., a bottom layer) that can respond to longer wavelengths of light (e.g., red light). Because longer wavelengths can be absorbed at greater depth by photodiodes 204 and 240, the first layer of photodiodes (e.g., photodiodes 205, 207, and 209 of FIG. 2A and photodiode 246 of FIG. 2B) can absorb red and/or green wavelengths of light, and the second layer of photodiodes (e.g., photodiodes 206, 208, and 210 of FIG. 2A and photodiode 248 of FIG. 2B) can absorb blue and/or green wavelengths of light. Thus, photodiodes 205, 207, and 209 of FIG. 2A and photodiode 246 of FIG. 2B can correspond to red and/or green pixels and photodiodes 206, 208, and 210 of FIG. 2A and photodiode 248 of FIG. 2B can correspond to blue and/or green pixels.

In some embodiments, in addition to or instead of color pixels, one or more photodiodes 204 and/or photodiodes 240 (e.g., a dual layer pair of photodiodes such as photodiodes 205 and 206, photodiodes 207 and 208, or photodiodes 209 and 210 of FIG. 2A and/or photodiodes 246 and 248 of FIG. 2B) can include one or more clear pixels. The one or more clear pixels can absorb a combination of various wavelengths of light (e.g., red, green, and blue wavelengths of light). In some cases, a single layer of photodiodes (e.g., a top or bottom layer of photodiodes) can include a combination of clear pixels and color pixels.

Because clear pixels can be more sensitive to light as compared to color pixels, clear pixels can improve the imaging performance of image sensor 200 under low light conditions. In addition, clear pixels can enable high speed imaging under normal lighting conditions.

In other embodiments, in addition to or instead of color pixels, one or more photodiodes 204 and/or photodiodes 240 (e.g., a dual layer pair of photodiodes such as photodiodes 205 and 206, photodiodes 207 and 208, or photodiodes 209 and 210 of FIG. 2A and/or photodiodes 246 and 248 of FIG. 2B) can include one or more luminance pixels (e.g., pixels with brightness information corresponding to a color image). Luminance pixels can have a spectral response that is wider than the spectral response of green pixels, but the spectral response of the luminance pixels can be narrower than a full response.

In further embodiments, in addition to or instead of color pixels, one or more photodiodes 204 and/or photodiodes 240 (e.g., a dual layer pair of photodiodes such as photodiodes 205 and 206, photodiodes 207 and 208, or photodiodes 209 and 210 of FIG. 2A and/or photodiodes 246 and 248 of FIG. 2B) can include one or more infrared pixels (e.g., pixels capable of absorbing near infrared and infrared signals).

In some embodiments, for image devices that use visible light responses, image sensor 200 can include an infrared ("IR") cutoff filter 220, which can be positioned over a CFA (not shown in FIG. 2A or FIG. 2B) or photodiodes (e.g., photodiodes 204 of FIG. 2A and/or photodiodes 240 of FIG. 2B) to ensure correct color imaging. IR cutoff filter 220 can limit the effects of IR light on the responses of photodiodes 204. For example, IR cutoff filter 220 can block undesirable IR light from reaching the photodiodes. In some cases, lens 222, which can be positioned over IR cutoff filter 220, can focus light on the photodiodes. For example, light passing through lens 222 can pass through IR cutoff filter 220 and fall on the photodiodes. Lens 222 can include any suitable lens such as, for example, a single lens or multiple microlenses. Thus, in one configuration, each micro-lens can be formed over one or more corresponding photodiodes.

In some embodiments, if one or more photodiodes are infrared pixels, IR cutoff filter 220 can cover the one or more infrared pixels, and can thereby behave as a dual band IR cutoff filter. For example, IR cutoff filter 220 can pass both visible light and certain portions of the IR light by creating an extra window in the IR band.

Turning now to FIG. 3, a cross-sectional view of image sensor 300 is shown. Image sensor 300 can be the same as or substantially similar to image sensor 110 of FIG. 1. Image sensor 300 can include substrate 302, photodiodes 304 (e.g., photodiodes 305-310), insulation layer 312, color filter array ("CFA") 314, IR cutoff filter 316, and lens 318. In one configuration, CFA 314 can be positioned over photodiodes 304, and IR cutoff filter 316 can be positioned over CFA 314.

Persons skilled in the art will appreciate that photodiodes 304 can include one or more single layer photodiode pixel structures, one or more dual layer photodiode pixel structures, and/or any combination thereof. Persons skilled in the art will also appreciate that photodiodes 304 can include any suitable number of layers in a particular photodiode pixel structure.

CFA 314 can include one or more filter elements that may correspond to the desired color responses required for a color system. For example, as shown in FIG. 3, CFA 314 can include magenta filter element 320, which can be positioned over one or more photodiodes 304 (e.g., a dual layer pair of photodiodes such as photodiodes 307 and 308). In some cases, photodiodes 307 and 308 can correspond to red and blue pixels, respectively. In some embodiments, in order to produce a desired color reproduction quality in photodiodes 304, CFA 314 can include magenta filer element 320 if photodiodes 304 are unable to achieve a desired quantum efficiency response for red and blue pixels.

As another example, CFA 314 can include green filter element 322, which can be positioned over one or more photodiodes 304 (e.g., a dual layer pair of photodiodes such as photodiodes 305 and 306). In some cases, photodiodes 305 and 306 can correspond to green pixels. Persons skilled in the art will appreciate that, in addition to or instead of a magenta filter element 320 and/or green filter element 322, CFA 314 can include one or more blue, red, yellow, and/or cyan filter elements.

For the one or more photodiodes, one or more filter elements (e.g., filter elements 320 and 322) of CFA 314 can separate out a particular spectral response of light (e.g., a combination of red and blue spectral responses or green spectral responses) by, for example, blocking passage of other spectra of light. For instance, light passing through lens 318 can pass through IR cutoff filter 316 and filter elements 320 and 322. The filtered light can then fall on a dual layer pair of photodiodes such as photodiodes 307 and 308 or photodiodes 305 and 306.

In some embodiments, clear pixels of photodiodes 304 (e.g., a dual layer pair of photodiodes such as photodiodes 309 and 310) can be those pixels that are associated with no CFA coating on CFA 314.

Turning next to FIG. 4, a cross-sectional view of image sensor 400 is shown. Image sensor 400 can be the same as or substantially similar to image sensor 110 of FIG. 1. Image sensor 400 can include substrate 402, photodiodes 404 (e.g., photodiodes 405-410), insulation layer 412, CFA 414, IR cutoff filter 416, and lens 418. Persons skilled in the art will appreciate that photodiodes 404 can include one or more single layer photodiode pixel structures, one or more dual layer photodiode pixel structures, and/or any combination thereof.

The imaging capabilities of image sensor 400 can vary depending on the types of pixels that correspond to one or more of photodiodes 404. For example, photodiodes 405-408 can correspond to color pixels (e.g., green, red, and/or blue pixels), and photodiodes 409 and 410 can correspond to clear pixels. As shown for image sensor 400, IR cutoff filter 416 can cover only a subset of photodiodes 404 corresponding to color pixels (e.g., photodiodes 405-408). The remaining photodiodes 404 that are uncovered can correspond to clear pixels (e.g., photodiodes 409 and 410) and can bring additional IR sensing capabilities and resolution to image sensor 400. For example, photodiodes 409 and 410 can sense an infrared signal that is beyond the visible light wavelength, which can thus be used to enable night vision application for image sensor 400. Furthermore, because the color pixels can still be filtered by IR cutoff filter 416, image sensor 400 can continue to render high-quality color images.

As another example, photodiodes 405-408 can correspond to color pixels, and photodiodes 409 and 410 can correspond to luminance pixels. Thus, if IR cutoff filter 416 only covers photodiodes 405-408, photodiodes 409 and 410 can remain uncovered. Similar to an image sensor incorporating uncovered clear pixels, the luminance pixels can also provide additional IR sensing capabilities for image sensor 400. However, the resulting image sensor configuration may be less sensitive to light because luminance pixels may have a lower sensitivity to light as compared to clear pixels.

Figure 5:
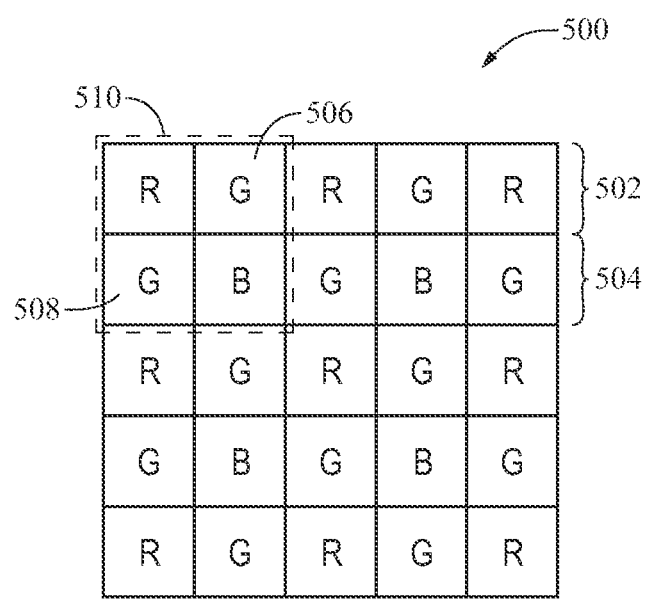
FIG. 5 is a representation of a typical color filter array ("CFA") in a Bayer pattern.

As discussed in connection with FIG. 3, a typical image sensor (e.g., image sensor 110 of FIG. 1) can use a CFA (e.g., CFA 314 of FIG. 3 or CFA 414 of FIG. 4) to generate a Bayer pattern from a color image. For example, FIG. 5 shows a representation of CFA 500 in a Bayer pattern in accordance with embodiments of the invention. As shown in FIG. 5, CFA 500 can have a repeating patterns of alternating rows of green and red filters (e.g., row 502) with rows of blue and green filters (e.g., row 504).

Turning now to FIGS. 6A-6L, these figures show illustrative representations of pixel arrangements in accordance with embodiments of the invention. These pixel arrangements can represent arrangements of photodiodes with a dual layer photodiode pixel structure. These photodiodes can be the same as or similar to photodiodes 204 of FIG. 2A, photodiodes 240 of FIG. 2B, photodiodes 304 of FIG. 3, and/or photodiodes 404 of FIG. 4. In some embodiments, at least one pixel in a second layer (e.g., top layer) of the photodiodes can have a different color than a pixel at the same position in a first layer (e.g., bottom layer) of the photodiodes.

As shown in FIGS. 6A-6L, "R/B" pixels can correspond to dual layer photodiode pixels with red and blue pixels stacked together at the same positions (e.g., a red pixel at a particular position in a bottom layer of the photodiodes and a blue pixel stacked on top of the red pixel at the same position in a top layer of the photodiodes). As another example, "C" pixels can correspond to dual layer photodiode pixels with two clear pixels stacked together at the same position (e.g., clear pixels at the same positions in both a top layer and a bottom layer of the photodiodes). As yet another example, "IR" pixels can correspond to dual layer photodiode pixels with two infrared pixels stacked together at the same position (e.g., infrared pixels at the same positions in both a top layer and a bottom layer of the photodiodes). As a further example, "G" pixels can correspond to dual layer photodiode pixels with two green pixels stacked together at the same position (e.g., green pixels at the same positions in both a top layer and a bottom layer of the photodiodes). As yet a further example, "G" pixels can correspond to only one integrated layer of green pixels. For instance, a top layer of photodiodes can be combined with a bottom layer of photodiodes without any insulation in between the two layers (e.g., photodiodes 242 and 244 of FIG. 2B).

Persons skilled in the art will appreciate that the representations in FIGS. 6A-6L are merely exemplary, and that an image sensor (e.g., image sensor 110 of FIG. 1, image sensor 200 of FIG. 2A, image sensor 230 of FIG. 2B, image sensor 300 of FIG. 3, and/or image sensor 400 of FIG. 4) can include any suitable pixel arrangement. For example, one or more clear pixels in a pixel arrangement can be replaced with one or more green pixels, one or more luminance pixels (e.g., luminance pixels at the same positions in both a top layer and a bottom layer of the photodiodes), one or more infrared pixels (e.g., infrared pixels at the same positions in both a top layer and a bottom layer of the photodiodes), one or more cyan pixels (e.g., a green pixel at a particular position in a bottom layer of the photodiodes and a blue pixel stacked on top of the green pixel at the same position in a top layer of the photodiodes), one or more yellow pixels (e.g., a red pixel at a particular position in a bottom layer of the photodiodes and a green pixel stacked on top of the red pixel at the same position in a top layer of the photodiodes), any other suitable pixels, and/or any combination thereof. As another example, one or more green pixels in a pixel arrangement can be replaced with one or more clear pixels, one or more luminance pixels, one or more infrared pixels, one or more cyan pixels, one or more yellow pixels, any other suitable pixels, and/or any combination thereof. As yet another example, one or more pixels in these pixel arrangements can be replaced with stack IR pixels. Stack IR pixels can correspond to dual layer photodiode pixels with an infrared pixel and either a color, clear, or luminance pixel stacked together at the same position (e.g., an infrared pixel at a particular position in a bottom layer of the photodiodes and either a color, clear, or luminance pixel stacked on top of the infrared pixel at the same position in a top layer of the photodiodes).

Figure 6A:
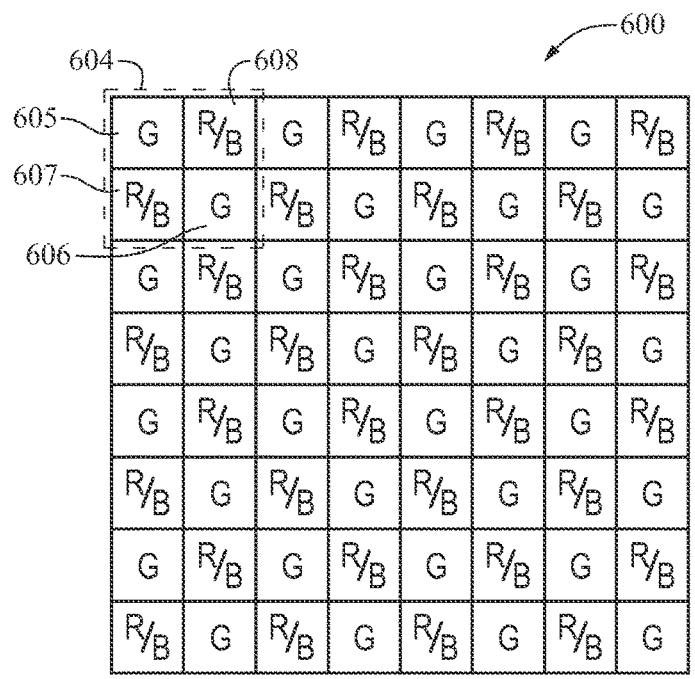
FIGS. 6A-6L are representations of pixel arrangements in accordance with embodiments of the invention.
Figure 6B:
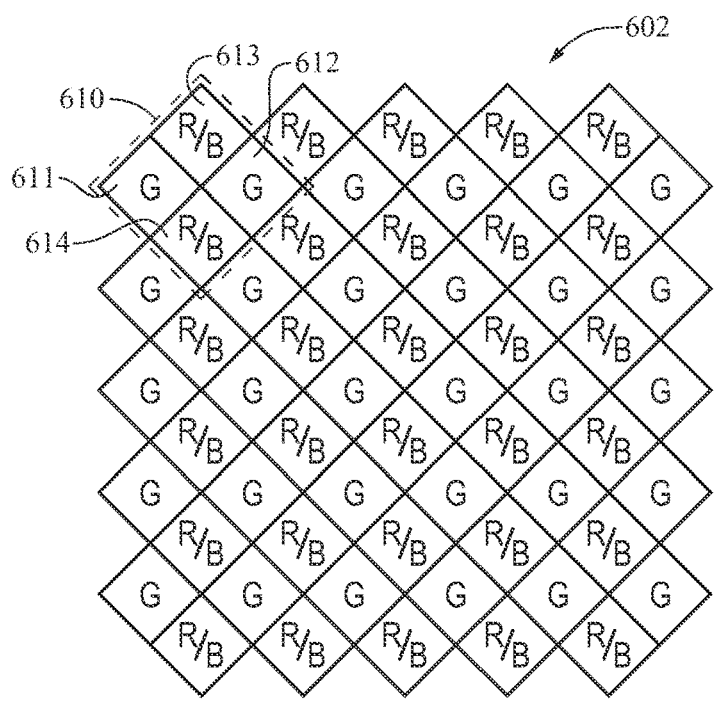

Turning first to FIGS. 6A and 6B, pixel arrangements 600 and 602 show two illustrative pixel arrangements for G and R/B pixels. For example, pixel arrangement 600 of FIG. 6A can provide an adamantine (e.g., a checkerboard) pattern of pixels. As another example, pixel arrangement 602 of FIG. 6B can provide a rectilinear pattern of pixels. For the rectilinear pattern of pixel arrangement 602, at least one line (e.g., every row and column) of the top and bottom layers of pixel arrangement 602 have pixels of the same color.

Pixel arrangement 600 can provide for efficient binning (e.g., downsampling) of the one or more pixels. The binning can be executed by control circuitry of an image system (e.g., control circuitry 120 of FIG. 1). For example, the control circuitry can separately bin one or more pixel clusters of pixel arrangement 600.

For instance, for pixel cluster 604 of pixel arrangement 600, control circuitry can bin a set of pixels (e.g., G pixels 605 and 606) along a first direction in order to form a first pixel group. The first direction can, for example, be along a diagonal direction of −45°. In addition, for the same pixel cluster 604, the control circuitry can bin another set of pixels (e.g., R/B pixels 607 and 608) along a second direction (e.g., a diagonal direction of 45°) to form a second pixel group. Because pixels in the first and second pixel groups (e.g., G pixels 605 and 606 and R/B pixels 607 and 608) have a shorter distance relative to one another as compared to pixels that are positioned vertically or horizontally, the control circuitry can bin pixel arrangement 600 without generating as many artifacts as would be generated from binning pixels arranged in a Bayer pattern (e.g., a Bayer pattern as shown in FIG. 5).

Binning can similarly be performed by the control circuitry for pixel arrangement 602 of FIG. 6B. For example, for pixel cluster 610 of pixel arrangement 602, the control circuitry can bin a set of pixels (e.g., G pixels 611 and 612) along a first direction (e.g., a horizontal direction) to form a first pixel group. In addition, for the same pixel cluster 610, the control circuitry can bin another set of pixels (e.g., R/B pixels 613 and 614) along a second direction (e.g., a vertical direction) to form a second pixel group.

After binning, the control circuitry can combine first pixel group and the second pixel group to form a binned pixel cluster. Due to the dual layer photodiode pixel structure of pixel arrangement 600 of FIG. 6A and pixel arrangement 602 of FIG. 6B, the center pixel of both binned pixel clusters will have a red-green-blue ("RGB") triplet without requiring any demosaic processing. In some embodiments, for pixel arrangement 600 of FIG. 6A, the control circuitry can interpolate the binned pixel cluster to output a pixel image after binning. For example, the control circuitry can output a 2× pixel image with a rectilinear pattern.

Figure 6C:
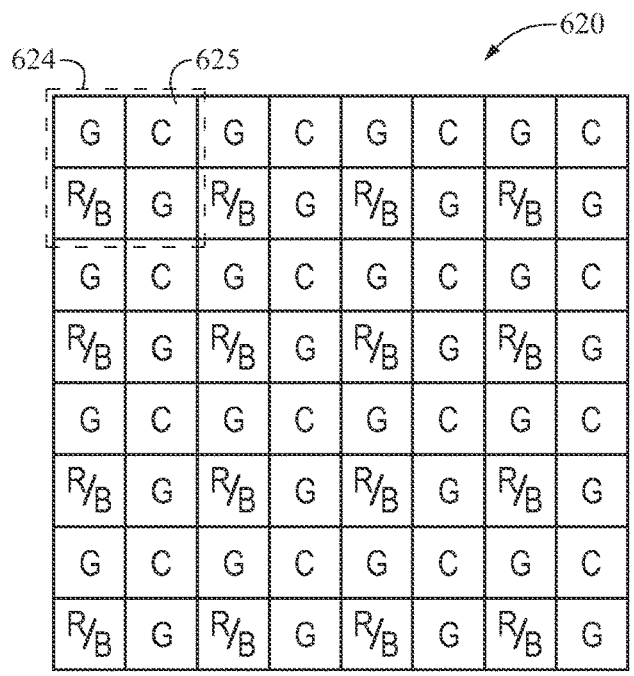
Figure 6D:
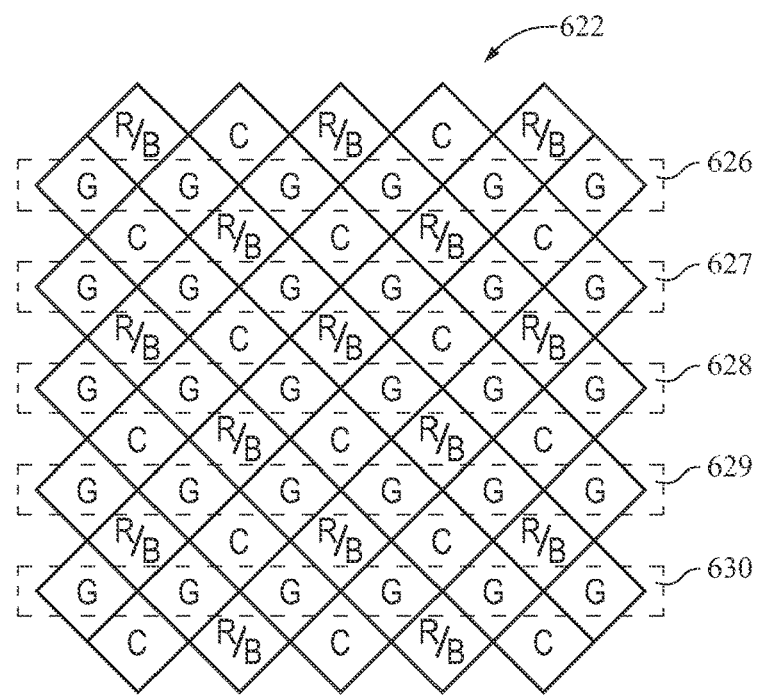

Turning next to FIGS. 6C and 6D, pixel arrangements 620 and 622 show two illustrative pixel arrangements for C, G, and R/B pixels. For example, pixel arrangement 620 of FIG. 6C can provide an adamantine pattern of pixels. As another example, pixel arrangement 622 of FIG. 6D can provide a rectilinear pattern of pixels. For the rectilinear pattern of pixel arrangement 622, at least one line (e.g., rows 626-630) of the top and bottom layers of pixel arrangement 622 can have pixels of the same color.

In some embodiments, by using pixel arrangement 620 of FIG. 6C, an image sensor can obtain at least as much luminance resolution as with a regular Bayer pattern of a CFA (e.g., CFA 500 of FIG. 5). For example, for any particular pixel cluster (e.g., pixel cluster 624), pixel arrangement 620 can have the same amount of green pixels as compared to a pixel cluster (e.g., pixel cluster 510 of FIG. 5) of a Bayer pattern. For instance, for both of the configurations shown in FIGS. 5 and 6C, there are 2 green pixels for each 2×2 pixel cluster.

Because of the addition of C pixels (e.g., C pixels 625) in pixel arrangement 620, an image sensor employing pixel arrangement 620 has the additional advantage of higher sensitivity to light as compared to a regular Bayer pattern. Furthermore, because pixel arrangement 620 can provide the same amount of red and blue pixels as compared to a regular Bayer pattern, the additional sensitivity is gained without sacrificing red and blue color resolution. In other embodiments, by using pixel arrangement 622 of FIG. 6D, an image sensor can completely avoid green imbalance issues because the G pixels can be arranged along one or more lines of pixel arrangement 622 (e.g., along rows 626-630).

Figures 6E, 6F:
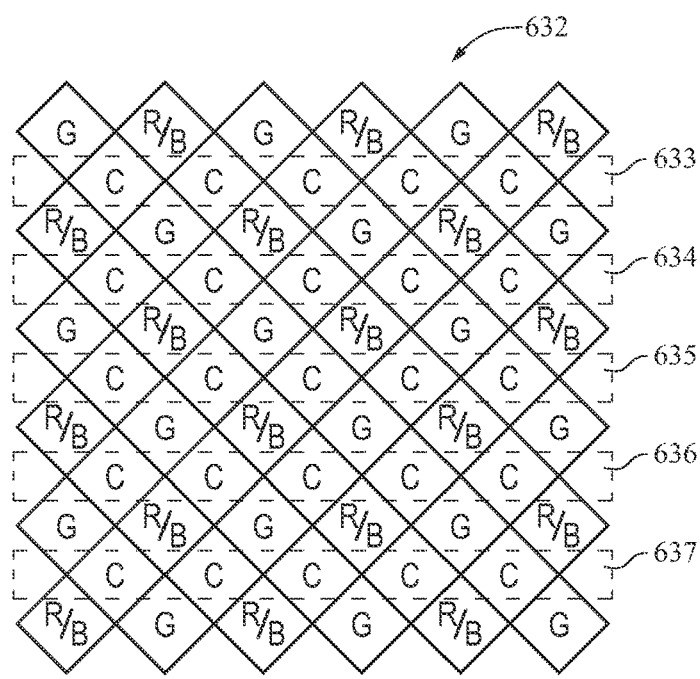

Turning to FIGS. 6E and 6F, pixel arrangements 631 and 632 show two additional illustrative pixel arrangements for C, G, and R/B pixels. For example, pixel arrangement 631 of FIG. 6E can provide an adamantine pattern of pixels. As another example, pixel arrangement 632 of FIG. 6F can provide a rectilinear pattern of pixels. For the rectilinear pattern of pixel arrangement 632, at least one line (e.g., alternate rows and columns) of the top and bottom layers of pixel arrangement 632 have pixels of the same color.

In comparison to pixel arrangements 620 of FIG. 6C and 622 of FIG. 6D, pixel arrangements 631 and 632 have a greater number of C pixels, thereby providing additional sensitivity to light. Furthermore, because pixel arrangement 632 provides C pixels along one or more lines (e.g., rows 633-637), pixel arrangement 632 can allow for separate exposures of C pixels and R/B and G pixels if per line control can be achieved. By separately exposing the C pixels and the R/B and G pixels, pixel arrangement 632 can allow an image sensor to simultaneously avoid saturation of the C pixels and improve the dynamic range of image capture.

Figure 6G:
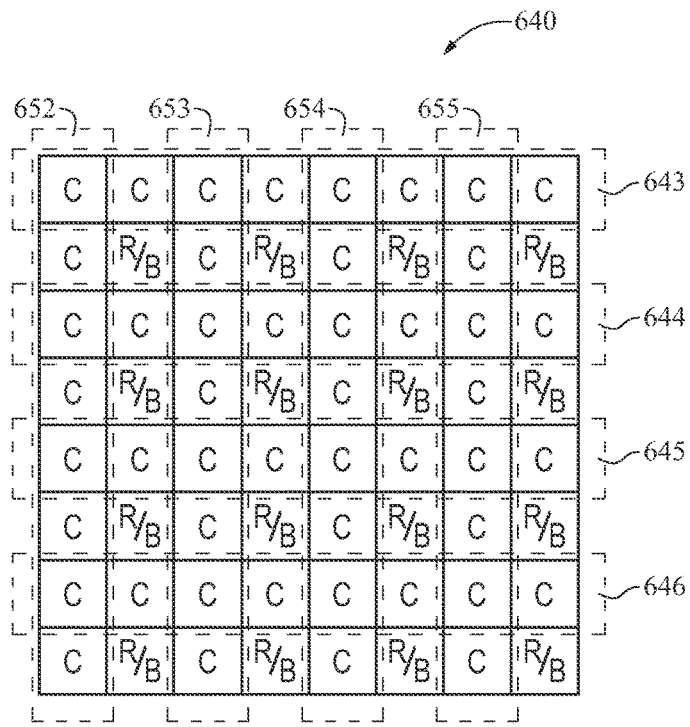
Figure 6H:
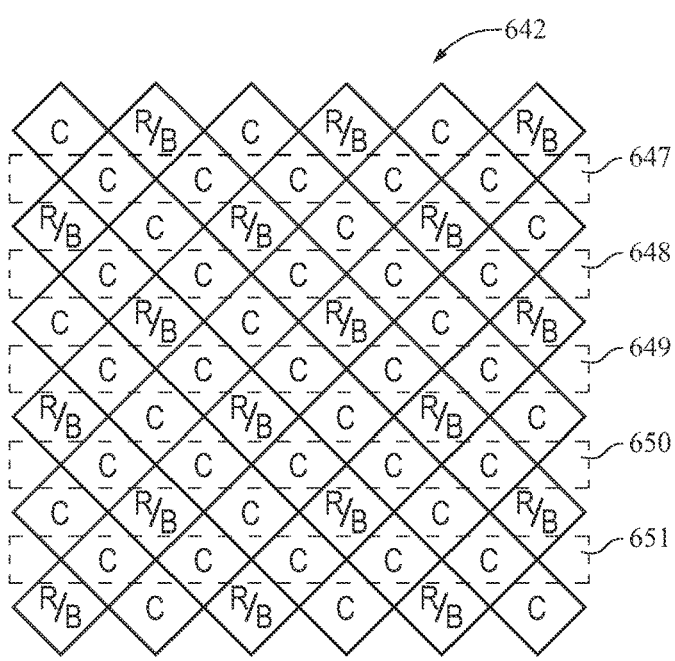

Turning next to FIGS. 6G and 6H, pixel arrangements 640 and 642 show two illustrative pixel arrangements for C and R/B pixels. For example, pixel arrangement 640 of FIG. 6G can provide an adamantine pattern of pixels. As another example, pixel arrangement 642 of FIG. 6H can provide a rectilinear pattern of pixels. For the rectilinear pattern of pixel arrangement 642, at least one line (e.g., alternate rows and columns) of the top and bottom layers of pixel arrangement 632 can have pixels of the same color.

Because of additional C pixels in pixel arrangements 640 and 642, pixel arrangements 640 and 642 can provide even more sensitivity to light as compared to pixel arrangements 631 of FIG. 6E and 632 of FIG. 6F. In some embodiments, pixel arrangements 640 and 642 can be used for low light conditions because of lower color resolution requirements.

As shown in FIGS. 6G and 6H, pixel arrangements 640 and 642 can provide C pixels along one or more lines (e.g., one or more rows 643-651 and one or more columns 652-655), which can allow for separate exposures of C pixels and R/B pixels if per line control can be achieved. By separately exposing the C pixels and the R/B pixels, pixel arrangements 640 and 642 can allow an image sensor to simultaneously avoid saturation of the C pixels and improve the dynamic range of image capture. This way, the image sensor can capture additional information from images than would otherwise be possible.

In some embodiments, G pixel values can be derived for pixel arrangements 640 and 642 using any suitable approach. For example, because clear pixels are a combination of green, red, and blue pixels, control circuitry (e.g., control circuitry 120) can obtain G pixel values by interpolating neighboring R/B pixel values and C pixel values jointly.

Figure 6I:
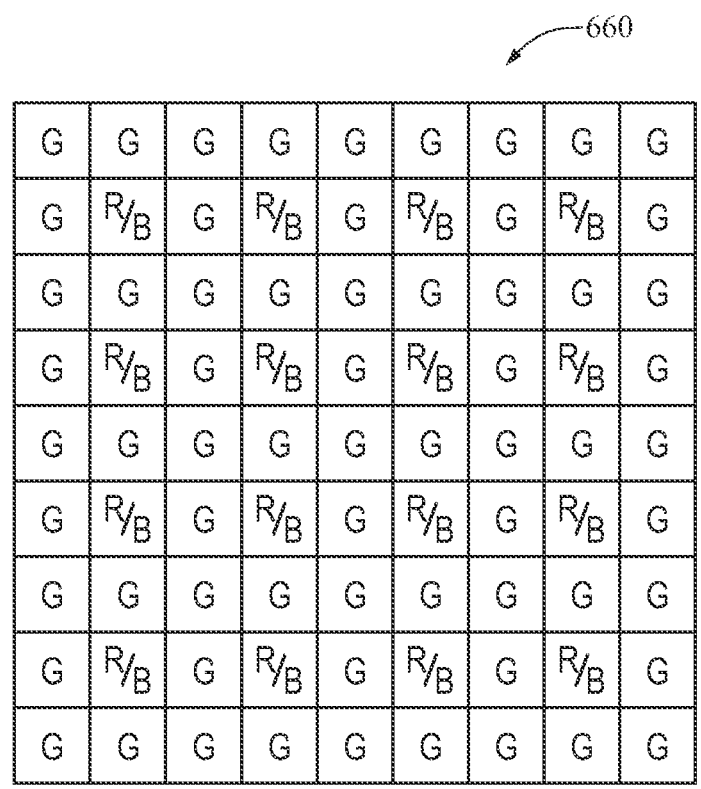
Figure 6J:
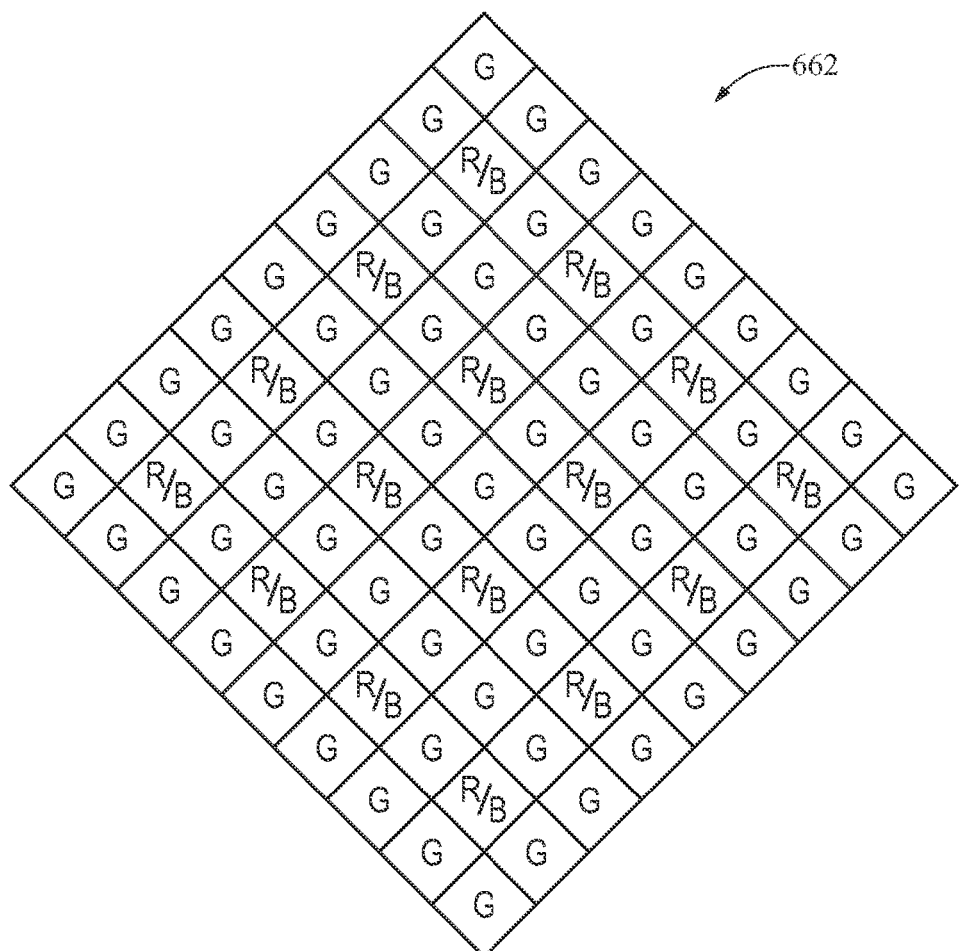

Turning now to FIGS. 6I and 6J, pixel arrangements 660 and 662 show two illustrative pixel arrangements for G and R/B pixels. For example, pixel arrangement 660 of FIG. 6I can provide a non-rotated pattern of pixels. As another example, pixel arrangement 662 of FIG. 6J can provide a rotated pattern of pixels.

Pixel arrangements 660 and 662 can include one or more G pixels that may have replaced one or more C pixels of pixel arrangements 620 (FIG. 6C), 622 (FIG. 6D), 631 (FIG. 6E), 632 (FIG. 6F), 640 (FIG. 6G), and 642 (FIG. 6H). In some embodiments, the number of G pixels in pixel arrangements 660 and 662 can exceed the number of R/B pixels.

Pixel arrangements can have any suitable pre-determined orientations (e.g., 10°, 20°, 30°, etc.). For example, pixel arrangement 660 can have a pre-determined arrangement of 0°. As another example, pixel arrangement 662 can have a pre-determined orientation of 45°. As a result of its pre-determined orientation, the sampling frequency of pixel arrangement 662 along the vertical and horizontal directions may be different from the sampling frequency of pixel arrangement 660 along the vertical, horizontal, and 45° directions.

Figures 6K, 6L:
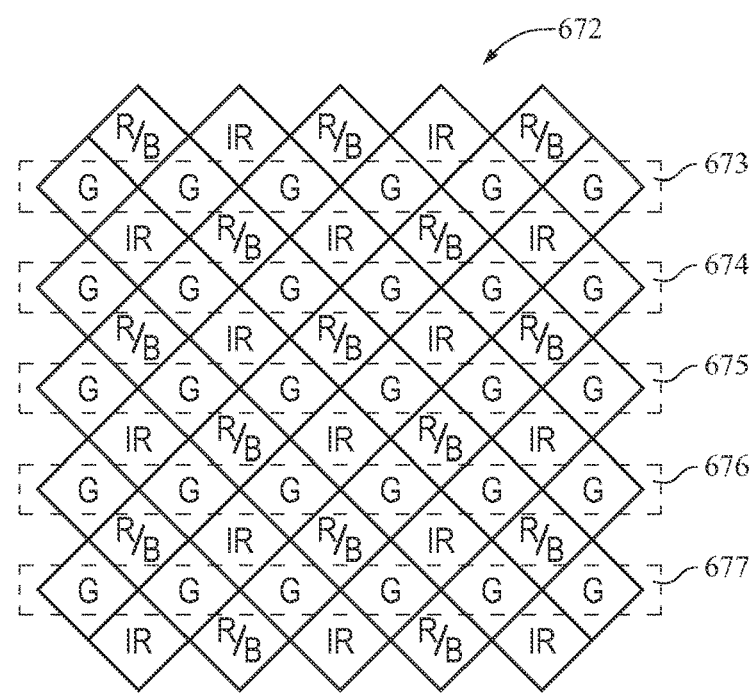

Turning next to FIGS. 6K and 6L, pixel arrangements 670 and 672 show two illustrative pixel arrangements for IR, G, and R/B pixels. Pixel arrangements 670 (FIG. 6K) and 672 (FIG. 6L) can be substantially similar to pixel arrangements 620 (FIG. 6C) and 622 (FIG. 6D), respectively. In particular, the C pixels of pixel arrangements 620 and 622 can be replaced with IR pixels in pixel arrangements 670 and 672.

Pixel arrangement 670 of FIG. 6K can provide an adamantine pattern of pixels. Moreover, pixel arrangement 672 of FIG. 6L can provide a rectilinear pattern of pixels. For the rectilinear pattern of pixel arrangement 672, at least one line (e.g., rows 673-677) of the top and bottom layers of pixel arrangement 672 can have pixels of the same color.

In some embodiments, by using pixel arrangement 670 of FIG. 6K, an image sensor can obtain at least as much luminance resolution as with a regular Bayer pattern of a CFA (e.g., CFA 500 of FIG. 5). For example, for any particular pixel cluster (e.g., pixel cluster 680), pixel arrangement 670 can have the same amount of green pixels as compared to a pixel cluster (e.g., pixel cluster 510 of FIG. 5) of a Bayer pattern. For instance, for both of the configurations shown in FIGS. 5 and 6K, there are 2 green pixels for each 2×2 pixel cluster.

Because of the addition of IR pixels (e.g., IR pixels 682) in pixel arrangement 670, an image sensor employing pixel arrangement 670 can be capable of absorbing near infrared signals and infrared signals. Furthermore, because pixel arrangement 670 can provide the same amount of red and blue pixels as compared to a regular Bayer pattern, this additional capability is gained without sacrificing red and blue color resolution. In other embodiments, by using pixel arrangement 672 of FIG. 6L, an image sensor can completely avoid green imbalance issues because the G pixels can be arranged along one or more lines of pixel arrangement 672 (e.g., along rows 673-677).

Figure 7:
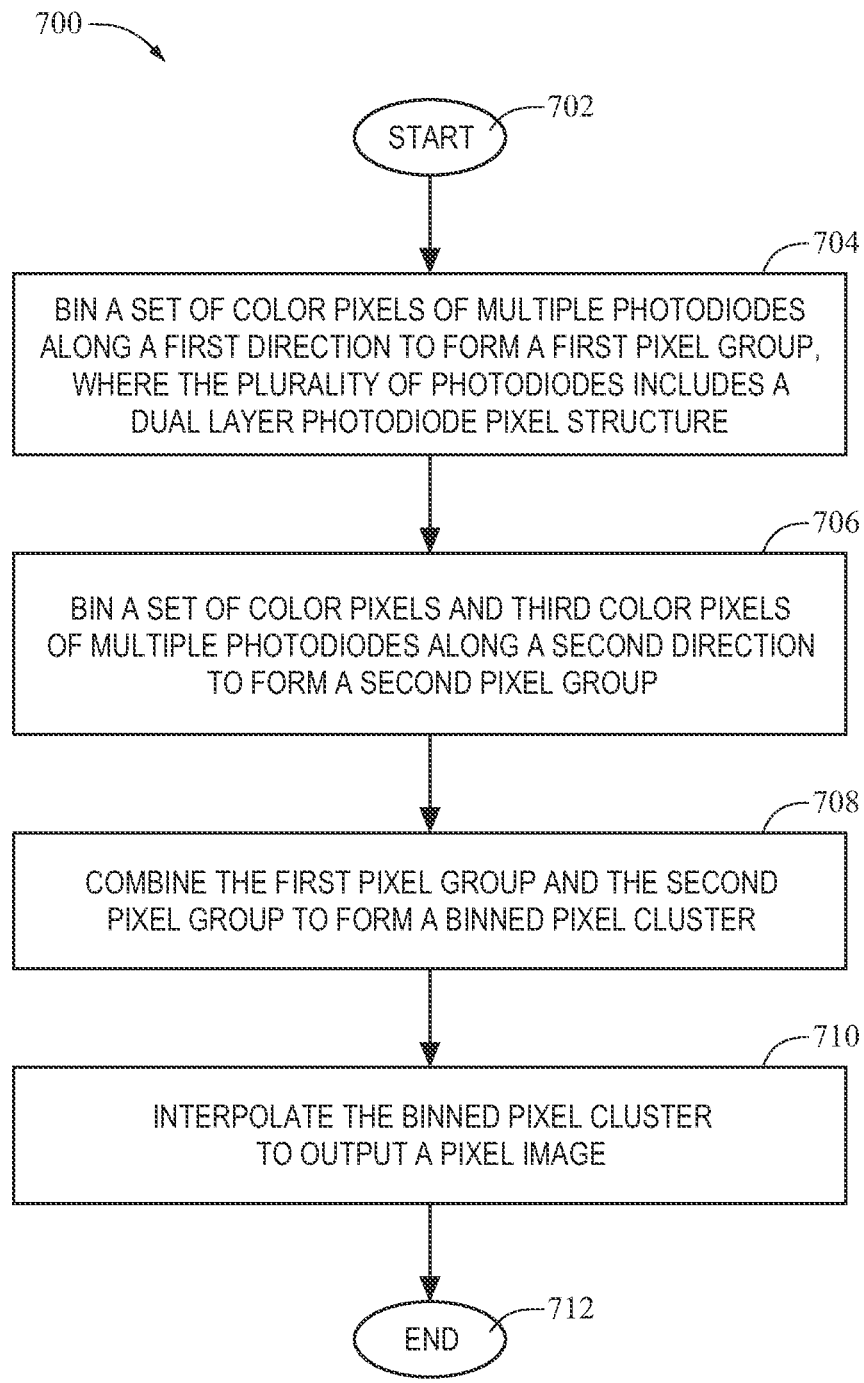
FIG. 7 is a flowchart of an illustrative process for binning photodiodes in accordance with embodiments of the invention.

As discussed previously, an image system (e.g., image system 100 of FIG. 1) can perform binning on one or more photodiodes. FIG. 7 is a flowchart of process 700 for binning photodiodes. In particular, process 700 can be executed by control circuitry (e.g., control circuitry 120 of FIG. 1) of an image system configured in accordance with embodiments of the invention. It should be understood that process 700 is merely illustrative, and that any steps can be removed, modified, combined, or any steps may be added, without departing from the scope of the invention.

Process 700 begins at step 702. At step 704, the control circuitry can bin a set of first color pixels (e.g., green pixels) of multiple photodiodes along a first direction to form a first pixel group, where the multiple photodiodes can include a dual layer photodiode pixel structure (e.g., photodiodes 204 of FIG. 2A, photodiodes 246 and 248 of FIG. 2B, photodiodes 304 of FIG. 3, or photodiodes 404 of FIG. 4). For example, for a particular pixel arrangement (e.g., pixel arrangements 600 and 602 of FIGS. 6A and 6B, respectively) of the multiple photodiodes, the control circuitry can bin G pixels (e.g., G pixels 605 and 606 of FIG. 6A or G pixels 611 and 612 of FIG. 6B) along a first direction (e.g., a diagonal direction of −45° or a horizontal direction).

Then, at step 706, the control circuitry can bin a set of second color pixels and third color pixels (e.g., red and blue pixels) of the multiple photodiodes along a second direction to form a second pixel group. For example, the control circuitry can bin R/B pixels (e.g., R/B pixels 607 and 608 of FIG. 6A or R/B pixels 612 and 613 of FIG. 6B) along a second direction (e.g., a diagonal direction of 45° or a vertical direction). In some embodiments, the first direction can be orthogonal to the second direction.

Continuing to step 708, the control circuitry can combine the first pixel group and the second pixel group to form a binned pixel cluster. After forming the binned pixel cluster, at step 710, the control circuitry can interpolate the binned pixel cluster to output a pixel image (e.g., a 2× pixel image with a rectilinear pattern). Process 700 then ends at step 712.

In conclusion, an image system with a dual layer photodiode structure is provided for processing color images. In particular, the image system can include an image sensor that can include photodiodes with a dual layer photodiode structure. In some embodiments, the dual layer photodiode can include a first layer of photodiodes (e.g., a bottom layer), a second layer of photodiodes (e.g., a top layer), and an insulation layer disposed between the bottom and top layers. The first layer of photodiodes can include one or more suitable pixels (e.g., green, red, clear, luminance, and/or infrared pixels). Likewise, the second layer of photodiodes can include one or more suitable pixels (e.g., green, blue, clear, luminance, and/or infrared pixels).

In contrast to conventional photodiodes, dual layer photodiodes can include additional clear pixels and still maintain the same or a greater number of green pixels. Thus, an image sensor incorporating dual layer photodiodes can gain light sensitivity with the additional clear pixels and maintain luminance information with the green pixels. The additional resolution and light sensitivity for such an image sensor can be advantageous for many situations (e.g., normal lighting conditions, low light conditions, and/or high speed imaging under normal lighting conditions).

In some embodiments, the image sensor can include a CFA that can include a magenta filter element. The magenta filter element, which can be positioned over one or more photodiodes, can allow the image sensor to achieve a desired quantum efficiency response.

In some embodiments, the image sensor can include an IR cutoff filter, which can cover only a subset of the photodiodes of the image sensor. For example, if the IR cutoff filter only covers photodiodes corresponding to color pixels, uncovered photodiodes corresponding to clear pixels can provide greater sensitivity and resolution to the image sensor. Furthermore, because the color pixels can still be filtered by the IR cutoff filter, the image sensor can continue to render high-quality color images.

In some embodiments, the image system can include control circuitry for processing data generated by an image sensor. For example, the control circuitry can bin pixels of multiple photodiodes of the image sensor. For example, the control circuitry can bin a set of first color pixels of the multiple photodiodes to form a first pixel group. In addition, control circuitry can bin a set of second color pixels and third color pixels of the multiple photodiodes to form a second pixel group. The control circuitry can then combine the first pixel group and the second pixel group to form a binned pixel cluster. After forming the binned pixel cluster, the control circuitry can interpolate the binned pixel cluster to output a pixel image (e.g., a 2× pixel image with a rectilinear pattern).

The described embodiments of the invention are presented for the purpose of illustration and not of limitation.

What is claimed is:

1. An image sensor comprising:
   a substrate having a major surface for receiving impinging light; and
   a photodiode array disposed within the substrate, wherein the photodiode array comprises a 2×2 unit cell, the 2×2 unit cell for repeating within the substrate and comprising:
      a first photodiode in the 2×2 unit cell comprising a first blue pixel in a top layer of the substrate disposed on top of a first red pixel in a bottom layer of the substrate, wherein the top layer is closer to the major surface than the bottom layer;
      a first insulating layer disposed between the red pixel and the first blue pixel;
      a magenta color filter disposed overlapping the first photodiode;
      a second photodiode in the 2×2 unit cell comprising a first green pixel disposed in the bottom layer and a third green pixel in the top layer and disposed on top of the first green pixel;
      a third photodiode in the 2×2 unit cell comprising a second green pixel disposed in the bottom layer and a fourth green pixel in the top layer and disposed on top of the second green pixel diagonally disposed from the second photodiode in the 2×2 unit cell; and
      a fourth photodiode in the 2×2 unit cell diagonally disposed from the first photodiode in the 2×2 unit cell comprising a pixel selected from a group consisting of a first clear pixel, a first infrared pixel, a blue pixel in the top layer disposed on top of a green pixel in the bottom layer, a green pixel in the top layer and disposed on top of a red pixel in the bottom layer, a green pixel in the top layer and disposed on top of an infrared pixel in the bottom layer, and a blue pixel in the top layer and disposed on top of an infrared pixel in the bottom layer.

2. The image sensor of claim 1 further comprising:
   a second insulating layer disposed between the third green pixel and the first green pixel; and
   a third insulating layer disposed between fourth green pixel and the second green pixel.

3. The image sensor of claim 1, wherein the fourth photodiode comprises the first infrared pixel.

4. The image sensor of claim 3 wherein:
   the first infrared pixel is disposed in the bottom layer; and
   the image sensor further comprises a second infrared pixel in the top layer and disposed on top of the first infrared pixel.

5. The image sensor of claim 3 further comprising an infrared cut-off filter disposed overlapping at least a portion of the photodiode array.

6. The image sensor of claim 1, wherein the fourth photodiode comprises the first clear pixel.

7. The image sensor of claim 6, wherein:
   the first clear pixel is disposed in the bottom layer; and
   the image sensor further comprises:
      a second clear pixel in the top layer and disposed on top of the first clear pixel; and
      a second insulating layer disposed between the second clear pixel and the first clear pixel.

8. The image sensor of claim 1 further in combination with a control structure configured to:
   bin the second and third photodiodes along a first direction to provide a first pixel group;
   bin the first and fourth photodiodes along a second direction to provide a second pixel group;
   combine the first pixel group and the second pixel group to provide a binned pixel cluster; and
   interpolate the binned pixel cluster to provide an output pixel image.

9. An image sensor comprising:
   a substrate having a major surface for receiving impinging light; and
   a photodiode array disposed within the substrate, wherein the photodiode array comprises a 2×2 unit cell, the 2×2 unit cell for repeating within the substrate and comprising:
      a first photodiode in the 2×2 unit cell comprising a first blue pixel in a first layer of the substrate disposed on top of a first red pixel in a second layer of the substrate, wherein the first layer is closer to the major surface than the second layer;
      a first insulating layer disposed between the red pixel and the first blue pixel;
      a magenta color filter disposed overlapping the first photodiode;
      a second photodiode in the 2×2 unit cell comprising a first pixel sensitive to at least two wavelengths of light disposed in the second layer and a third pixel in the first layer and disposed on top of the first pixel;
      a third photodiode in the 2×2 unit cell comprising a second pixel sensitive to the at least two wavelengths of light disposed in the second layer and a fourth pixel in the first layer and disposed on top of the second pixel, wherein the third photodiode is diagonally disposed from the second photodiode in the 2×2 unit cell; and a fourth photodiode in the 2×2 unit cell diagonally disposed from the first photodiode in the 2×2 unit cell comprising a pixel selected from a group consisting of a first green pixel, a clear pixel, a green pixel in the first layer and disposed on top of an infrared pixel in the second layer, and a blue pixel in the first layer and disposed on top of an infrared pixel in the second layer.

10. The image sensor of claim 9, wherein:
the second photodiode comprises a first clear pixel; and
the third photodiode comprises a second clear pixel.

11. The image sensor of claim 10, wherein the fourth photodiode comprises the first green pixel.

12. The image sensor of claim 11, wherein:
the first green pixel is in the second layer; and
the image sensor further comprises a second green pixel in the first layer and disposed on top of the first green pixel.

13. The image sensor of claim 10, wherein:
the first clear pixel and the second clear pixel are disposed in the second layer;
the second photodiode further comprises a third clear pixel in the first layer and disposed on top of the first clear pixel; and
the third photodiode further comprises a fourth clear pixel in the first layer and disposed on top of the second clear pixel.

14. The image sensor of claim 9, wherein:
the second photodiode comprises a first clear pixel;
the third photodiode comprises a second clear pixel; and
the fourth photodiode comprises the clear pixel.

15. An image sensor comprising:
a substrate having a major surface for receiving impinging light; and
a photodiode array disposed within the substrate, wherein the photodiode array comprises a 2×2 unit cell, the 2×2 unit cell for repeating within the substrate and comprising:
a first photodiode in the 2×2 unit cell comprising a first blue pixel in a top layer of the substrate disposed on top of a first red pixel in a bottom layer of the substrate, wherein the top layer is closer to the major surface than the bottom layer;
a first insulating layer disposed between the red pixel and the first blue pixel;
a magenta color filter disposed overlapping the first photodiode;
a second photodiode in the 2×2 unit cell comprising a first green pixel disposed in the bottom layer and a third green pixel in the top layer and disposed on top of the first green pixel;
a third photodiode in the 2×2 unit cell comprising a second green pixel disposed in the bottom layer and a fourth green pixel in the top layer and disposed on top of the second green pixel, wherein diagonally disposed from the second photodiode in the 2×2 unit cell; and
a fourth photodiode in the 2×2 unit cell comprising a first infrared pixel diagonally disposed from the first photodiode in the 2×2 unit cell.

16. The image sensor of claim 15 further comprising:
a second insulating layer disposed between the third green pixel and the first green pixel; and
a third insulating layer disposed between the fourth green pixel and the second green pixel.

17. The image sensor of claim 15, wherein:
the first infrared pixel is disposed in the bottom layer; and
the fourth photodiode further comprises a second infrared pixel in the top layer and disposed on top of the first infrared pixel.

18. The image sensor of claim 15 further comprising an infrared cut-off filter overlapping at least a portion of the photodiode array.

* * * * *